United States Patent [19]
Kamiya

[11] Patent Number: 5,782,370
[45] Date of Patent: Jul. 21, 1998

[54] CASING CAPABLE OF PROTECTING AN ELECTRONIC APPARATUS FROM STATIC ELECTRICITY

[75] Inventor: Shinichi Kamiya, Shizuoka, Japan

[73] Assignee: NEC Corporation, Tokyo, Japan

[21] Appl. No.: 908,987

[22] Filed: Aug. 8, 1997

[30] Foreign Application Priority Data

Aug. 8, 1996  [JP]  Japan ................................ 8-210279

[51] Int. Cl.⁶ ........................................................ B65D 6/28
[52] U.S. Cl. ........................ 220/4.02; 220/4.21; 220/784; 220/284
[58] Field of Search ............................... 220/4.02, 4.24, 220/4.22, 284, 784, 4.21, 2.1 R, 691, 682, DIG. 9, DIG. 21

[56] References Cited

U.S. PATENT DOCUMENTS

| | | | |
|---|---|---|---|
| 3,424,341 | 1/1969 | Slapnik | 220/784 |
| 4,521,464 | 6/1985 | Chapman | 220/4.24 |
| 4,711,350 | 12/1987 | Yen . | |
| 4,840,286 | 6/1989 | Heberling et al. | 220/4.02 |
| 4,854,473 | 8/1989 | Dubach . | |
| 4,991,730 | 2/1991 | Pehr | 220/284 |
| 5,111,362 | 5/1992 | Flamm et al. | 220/4.02 |
| 5,307,949 | 5/1994 | Von Holdt, Jr. | 220/284 |
| 5,390,807 | 2/1995 | Galaburda | 220/4.24 |
| 5,405,035 | 4/1995 | Kato | 220/4.24 |

*Primary Examiner*—Stephen J. Castellano
*Attorney, Agent, or Firm*—Ostrolenk, Faber, Gerb & Soffen, LLP

[57] ABSTRACT

A casing of the present invention and applicable to an electronic apparatus is made up of a first and a second casing part. The first casing part is formed with first spaced hooks and ribs intervening between the hooks. The second casing part is formed with second hooks respectively engageable with the first hooks, and recesses 7 intervening between the second hooks and respectively engageable with the ribs 5. A ridge is formed in each recess and prevents static electricity from entering the casing via a path between the casing parts.

5 Claims, 9 Drawing Sheets

CASING CAPABLE OF PROTECTING AN ELECTRONIC APPARATUS FROM STATIC ELECTRICITY

BACKGROUND OF THE INVENTION

1. Field of the Invention

The present invention relates to a casing for accommodating and protecting an electronic apparatus and, more particularly, to a casing for a radio pager, handy phone or similar miniature electronic apparatus.

2. Description of the Related Art

A casing for an electronic apparatus is usually made up of an upper casing part a lower casing part joined with each other. The problem with this conventional configuration is that a clearance exists between the two casing parts and admit static electricity into the casing and cause it to damage electronic parts accommodated in the casing. Another problem with the conventional casing is that the two casing parts cannot be smoothly engaged with each other.

SUMMARY OF THE INVENTION

It is therefore an object of the present invention to provide a casing for an electronic apparatus and capable of surely preventing static electricity from entering it, and promoting smooth engagement of its casing parts.

A casing for an electronic apparatus of the present invention has a first and a second casing part. The first casing part is formed with a plurality of first hooks spaced from each other, and a plurality of ribs each intervening between nearby ones of the first hooks. The second casing part is formed with a plurality of second hooks spaced from each other and engageable with the first hooks, and a plurality of recesses each intervening between nearby ones of the second hooks and engageable with the ribs. A plurality of ridges each is formed in the respective recess and located to face the respective rib in the widthwise direction of side walls included in the first and second casing parts for blocking a clearance between the end face of the respective rib and the end face of the respective recess facing each other.

The ridge intervening between the second hooks of the second casing part blocks a clearance between the casing parts and along which static electricity would enter the casing. This prevents static electricity from being admitted into the casing.

Further, the surface of the ridge and the surface of the rib facing each other when the recess and rib mate with each other have their ends rounded or cut. This prevents the edges of the above surfaces from interfering with each other when guiding each other. Therefore, the recess and rib can smoothly mate with each other.

BRIEF DESCRIPTION OF THE DRAWINGS

The above and other objects, features and advantages of the present invention will become apparent from the following detailed description taken with the accompanying drawings in which.

Figure 1:
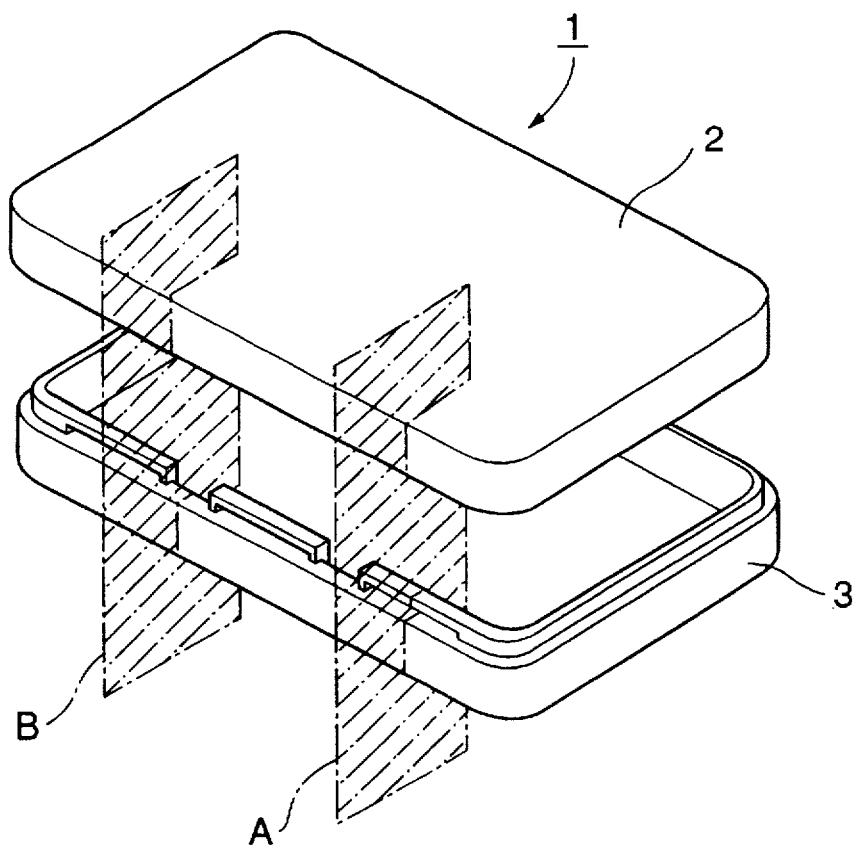
FIG. 1 is a perspective view showing a first and a second casing part constituting a conventional casing.

In the drawings, identical references denote identical structural elements.

DETAILED DESCRIPTION OF THE PREFERRED EMBODIMENT

Figure 2:
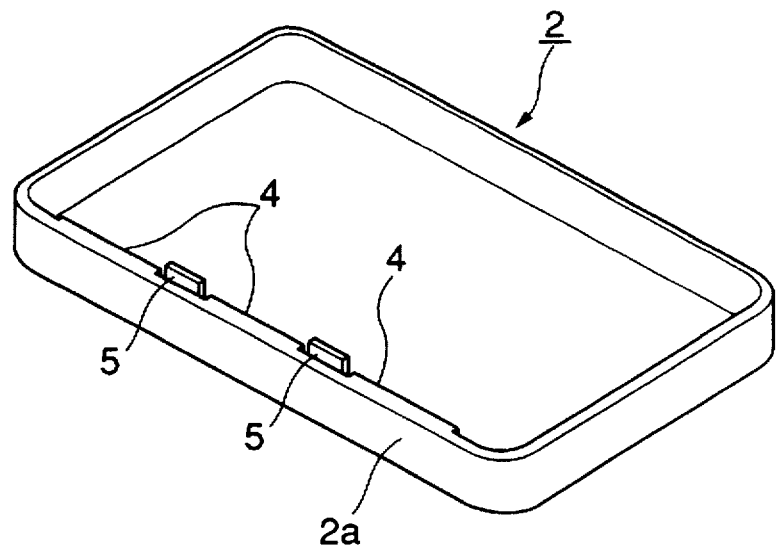
FIGS. 2 and 3 are perspective views respectively showing the first and second casing parts of FIG. 1.
Figure 3:
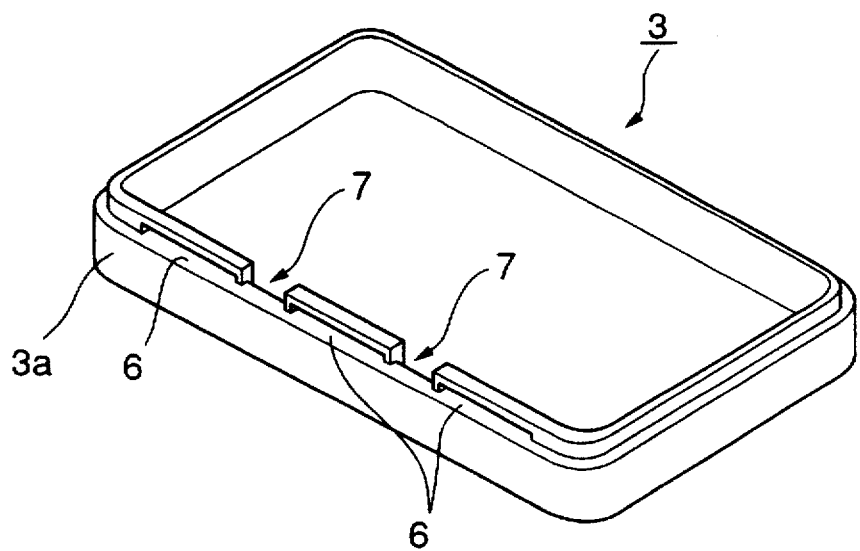
Figure 4:
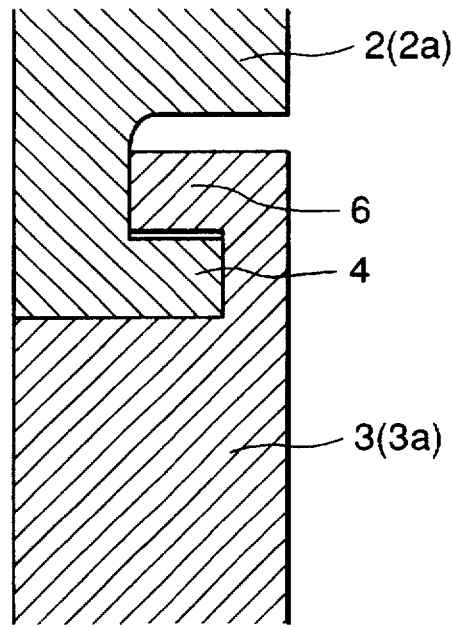
FIG. 4 is a section showing a first and a second hook engaged with each other when the two casings of FIG. 11 are joined together.
Figure 5:
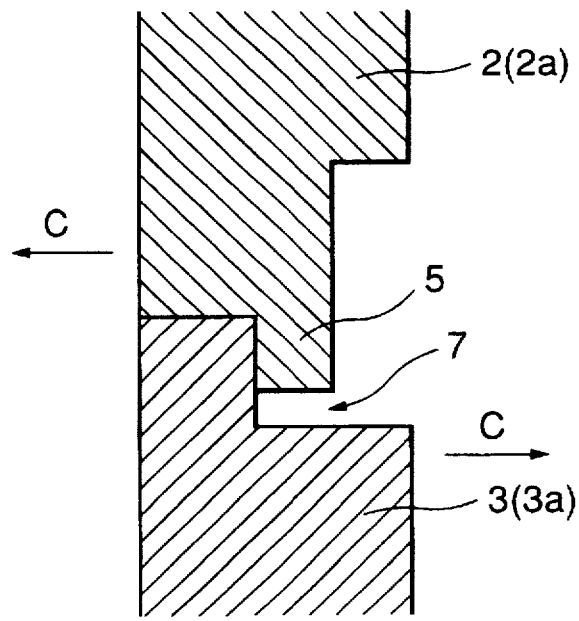
FIG. 5 is a section showing a rib and a recess engaged with each other when the casings of FIG. 1 are joined together.

To better understand the present invention, brief reference will be made to a conventional casing for an electronic apparatus, shown in FIGS. 1–6. As shown, the casing, generally 2, is made up of an upper or first casing part 2 and a lower or second casing part 3. As shown in FIG. 2, the upper casing part 2 includes a side wall 2a formed with first hooks 4 and ribs 5. As shown in FIG. 3, the lower casing part 3 includes a side wall 3a formed with second hooks 6 and recesses 7. The first and second hooks 4 and 6 are engageable with each other, and so are the hooks 6 and 7. FIG. 4 is a section in a plane A of FIG. 1, showing the hooks 4 and 6 engaged with each other. FIG. 5 is a section in a plane B of FIG. 1, showing the ribs 5 and recesses 7 engaged with each other.

As shown in FIG. 4, the hooks 4 and 6 prevent the upper and lower casing parts 2 and 3 from separating from each other in the up-and-down direction in which the side walls 2a and 2b may part from each other. However, the hooks 4 and 6 are separable in the horizontal direction indicated by an arrow C in FIG. 5, i.e., in the thicknesswise direction of the side walls 2a and 3a. To prevent the hooks 4 and 6 from separating in the direction C due to a shock ascribable to, e.g., a fall, the ribs 5 and recesses are engaged with each other.

Figure 6:
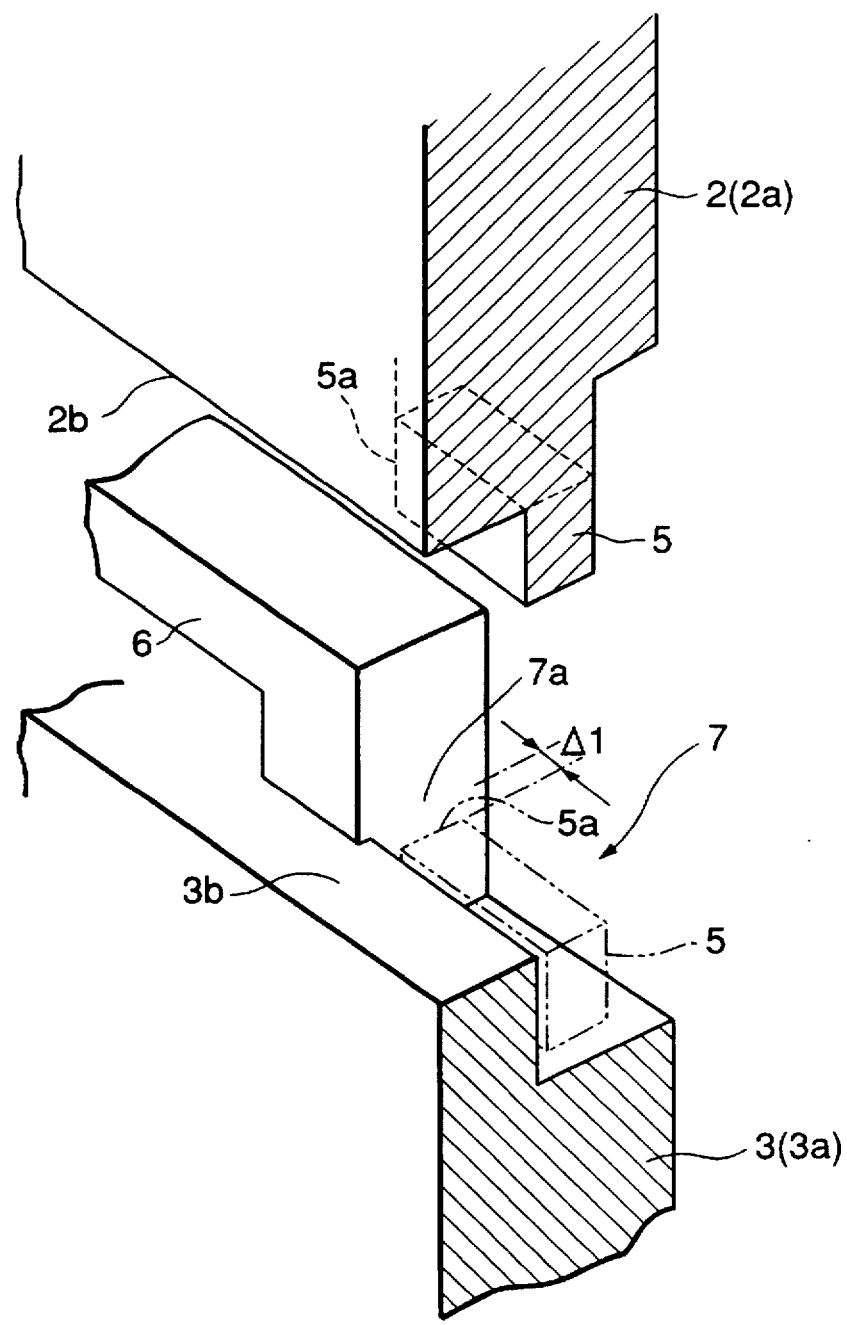
FIG. 6 is a fragmentary enlarged view of the casings shown in FIG. 1.

The above conventional casing 1 has some problems left unsolved, as follows. As shown in FIG. 6, a clearance exists between the end face 5a of each rib 5 in the widthwise direction and the end face 7a of the associated recess 7 and facing the end face 5a. This clearance admits static electricity into the casing 1 and causes it to damage electric parts present in the casing 1. In FIG. 6, a dash-and-dots line indicates a position at which the rib 5 is located when the casing parts 2 and 3 are joined together.

Specifically, a fine clearance Δ1 shown in FIG. 6 exists between the end face 5a of the rib 5 and the end face 7a of the recess 7 due to limited dimensional accuracy, among others, available with the casing parts 2 and 3. Assume that a clearance occurs between the end faces 2b and 3b of the walls 2a and 3a, respectively, when the casing parts 2 and 3 are joined with each other. Then, the inside of the casing 1 is communicated to the outside via the clearance Δ1 with the result that static electricity enters the casing 1.

Further, the ends of the hooks 4 and 6 each has an edge configuration. Therefore, when the casing parts 2 and 3 are connected to each other, the edges of the hooks 4 and 6 contact each other. This prevents the casing parts 2 and 3 from being smoothly connected to each other.

Reference will be made to FIGS. 7-10 for describing a casing embodying the present invention. As shown, the casing, generally 1, is made up of a first casing part 2 and a second casing part 3. The first casing part 2 includes a side wall 2a formed with first hooks 4 and ribs 5 while the second casing part 3 includes a side wall 3a formed with second hooks 6 and recesses 7. The first and second hooks 4 and 6 are engageable with each other, and so are the ribs 5 and recesses 7. A ridge 8 is formed in each recess 7 and has a height smaller than the height of the second hooks 6.

Figure 8:
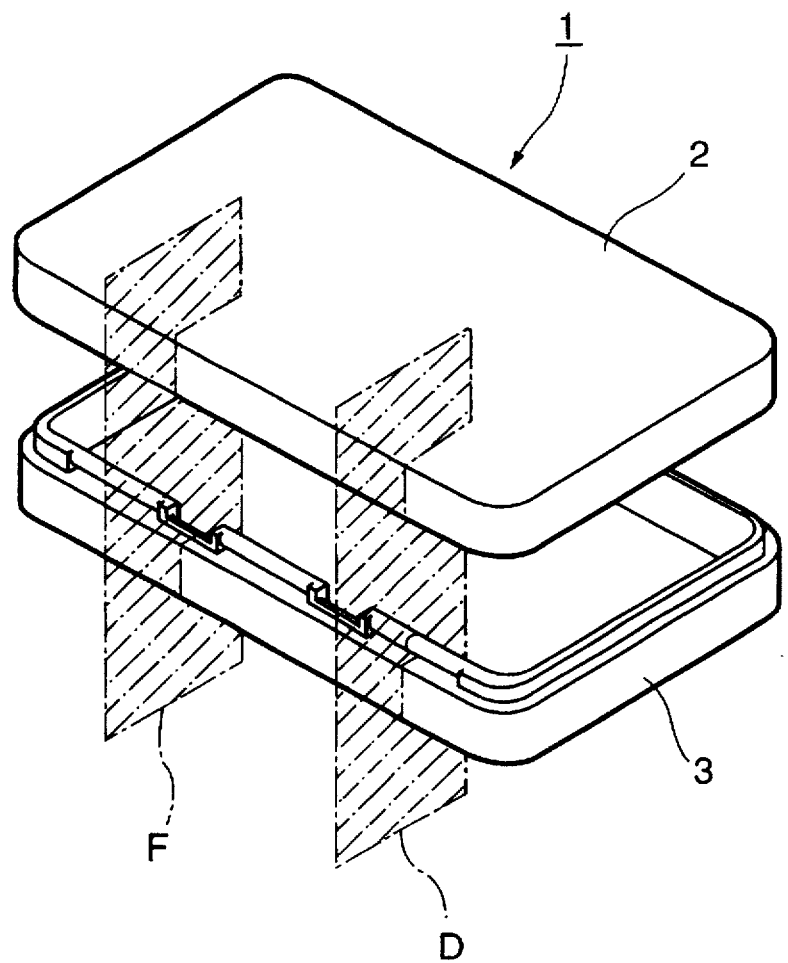
FIG. 8 is a perspective view showing a first and a second casing part constituting the casing of FIG. 7.
Figure 9:
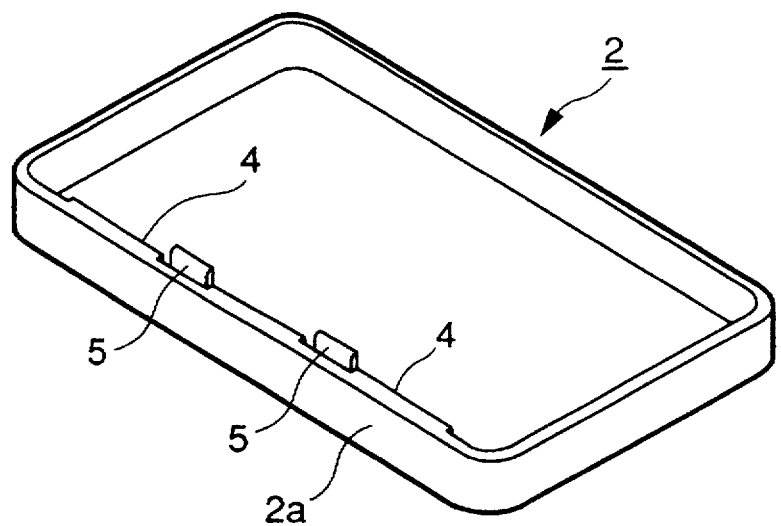
FIGS. 9 and 10 are perspective views respectively showing the first and second casing parts of FIG. 8.
Figure 11:
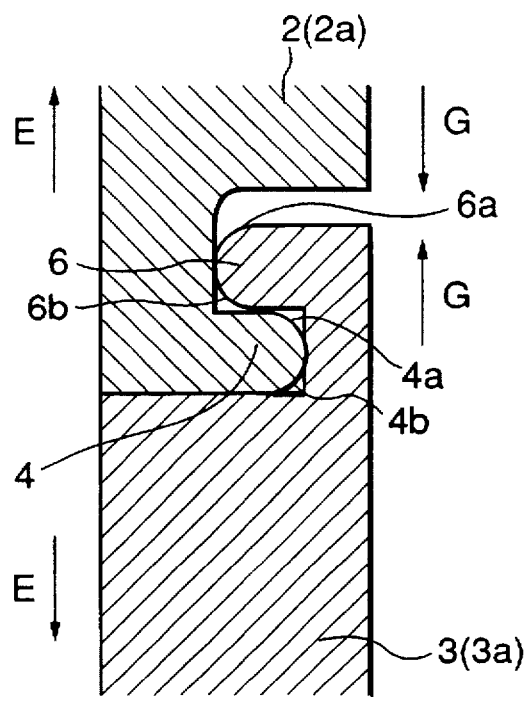
FIG. 11 is a section showing a first hook and a second hook engaged with each other when the casing parts shown in FIG. 10 are joined together.

FIG. 11 is a section in a plane D of FIG. 8, showing the hooks 4 and 6 engaged with each other. As shown, the hooks 4 and 6 have their corners 4a and 4b and 6a and 6b, respectively, rounded. In this condition, the hooks 4 and 6 prevent the casing parts 2 and 3 from separating from each other in a direction E in which the side walls 2a and 3a may part from each other.

Figure 10:
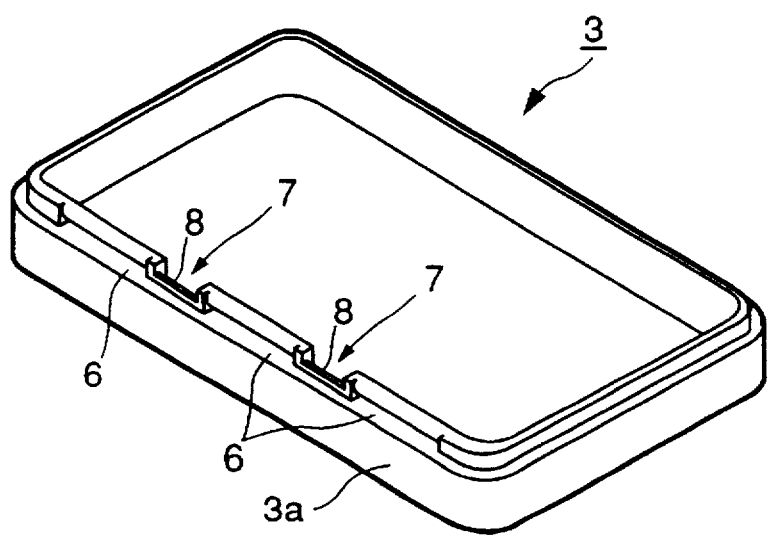
Figure 12:
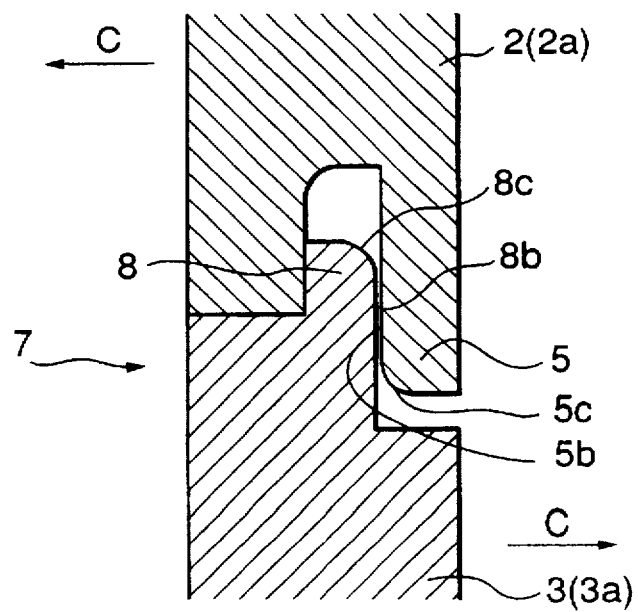
FIG. 12 is a section showing a rib and a recess engaged with each other when the casing parts shown in FIG. 10 are joined together.

FIG. 12 is a section in a plane F of FIG. 8, showing the ribs 5 and recesses 7 engaged with each other. As shown, each rib 5 and associated recess 7 are aligned with each other in the thicknesswise direction of the side walls 2a and 3a. In this condition, surfaces 5b and 8b included in the rib 5 and recess 7, respectively, and facing each other have their ends 5c and 8c rounded. The hooks 4 and 6 shown in FIG. 10 are separable in the thicknesswise direction of the side walls 2a and 3a, i.e., in the direction indicated by an arrow C in FIG. 12. In light of this, the ribs S and recesses 7 engaged with each other prevent the casing parts 2 and 3 from separating in the direction C.

Figure 7:
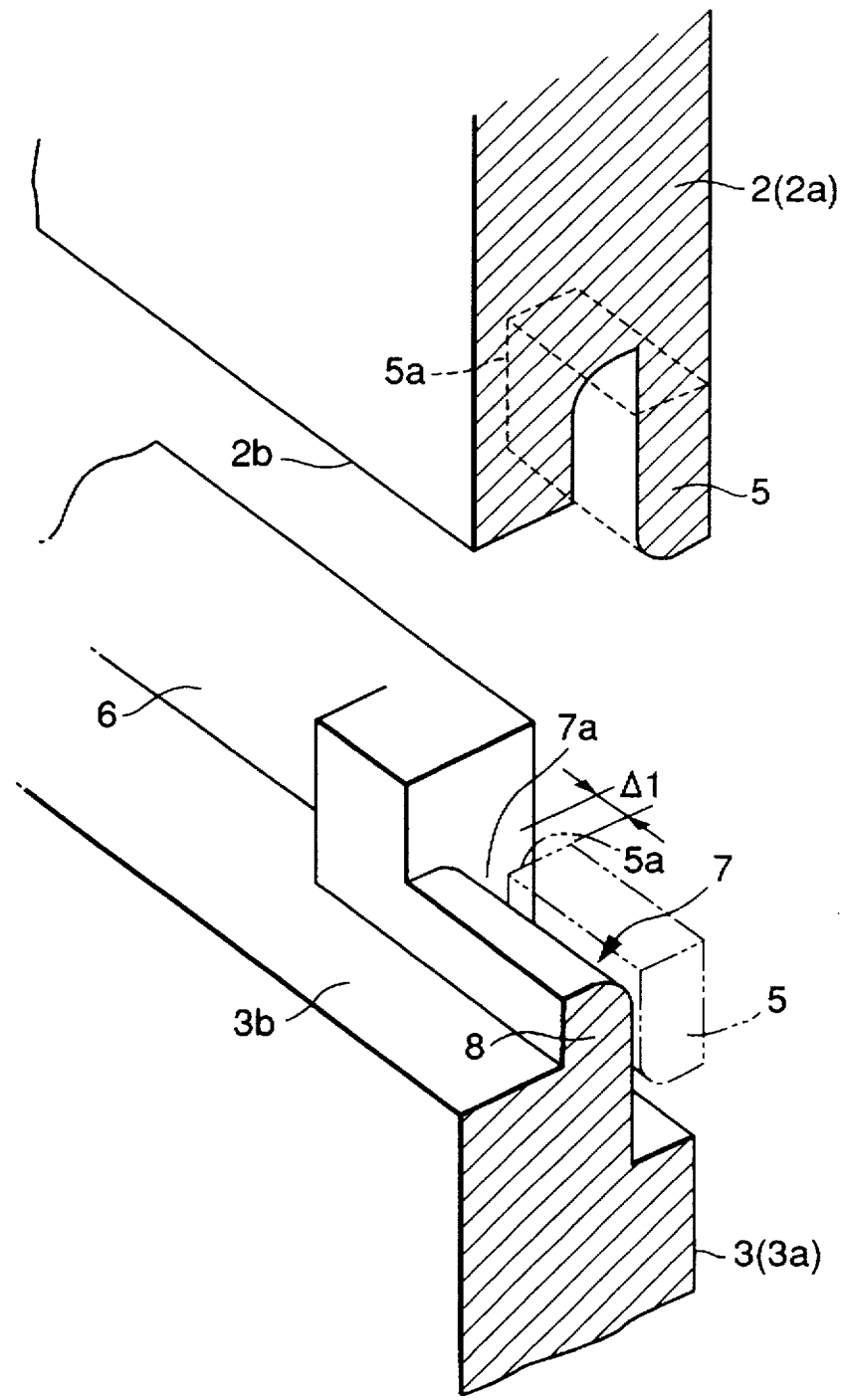
FIG. 7 is an enlarged perspective view showing a casing embodying the present invention.

As shown in FIG. 7, when the casing parts 2 and 3 are joined with each other, each rib 5 is located at a position indicated by a dash-and-dot line. A clearance A1 exists between the end face 5a of the rib 5 in the widthwise direction and the end face 7a of the recess 7 facing the end face 5a, as in the conventional casing 1 shown in FIG. 6. However, in the illustrative embodiment, the ridge 8 contiguous with the hook 6 isolates the inside of the casing 1 from the outside at the clearance A1 although a clearance may exist between the end faces 2b and 3b of the side walls 2a and 3a. Therefore, static electricity is surely prevented from being admitted into the casing 1.

As shown in FIG. 12, the surfaces 5b and 8b of the rib 5 and ridge 8, respectively, face and guide each other when the rib 5 and recess 7 mate with each other. Because the ends 5c and 8c of the surfaces 5b and 8b are rounded, the rib 5 and recess 7 and therefore the casing parts 2 and 3 can be smoothly joined with each other.

Further, as shown in FIG. 11, the corners 4a and 4b of the hook 4 and the corners 6a and 6b of the hook 6 which would interfere with each other in the event of engagement are rounded. The hooks 4 and 6 are engaged with each other in the direction indicated by an arrow G in FIG. 11. At this instant, the rounded corners 4a and 4b of the hook 4 and the rounded corners 6a and 6b of the hook 6 guide each other, promoting the smooth engagement of the hooks 4 and 6, i.e., casing parts 2 and 3. It is to be noted that the corners 4a, 4b, 6a and 6b each is formed by the end face and opposite side faces of a flat end portion included in the hook 4 or 6.

Figure 13:
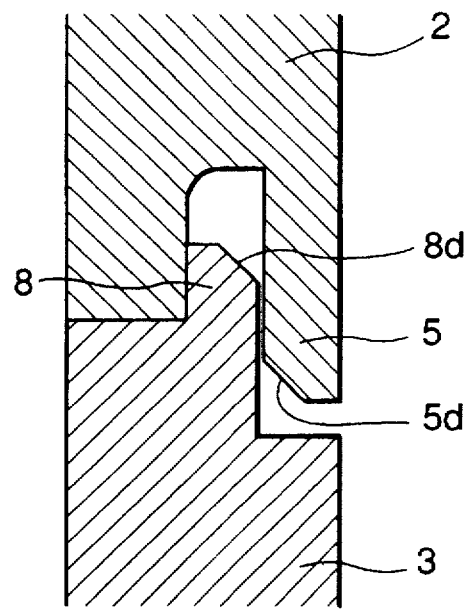
FIG. 13 is a section showing a modification of the illustrative embodiment.

FIG. 13 shows a modified form of the above embodiment. As shown, the surfaces of the ribs S and ridge 8 facing each other have their ends cut obliquely with respect to the direction of engagement in order to form slants 5d and 8d. The slants 5d and 8d are also successful to allow the casing parts 2 and 3 to be smoothly engaged with each other without the rib 5 and ridge 8 abutting against each other.

Figure 14:
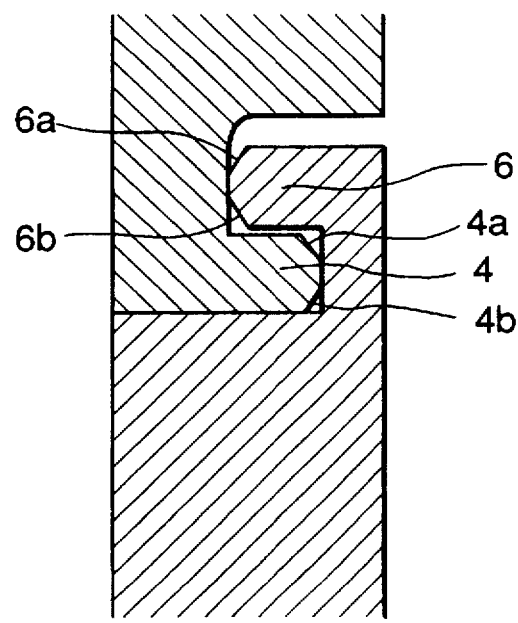
FIG. 14 is a section showing another modification of the illustrative embodiment.

FIG. 14 shows another modification of the illustrative embodiment. As shown, the corners 4a and 4b of the hook 4 and the corners 6a and 6b of the hook 6 are cut obliquely. This also promotes the smooth engagement of the casing parts 2 and 3.

In summary, in accordance with the present invention, a casing for an electronic part has a first and a second casing part engageable with each other and include first hooks and second hooks, respectively. Ridges existing between the first and second hooks block paths between the casing parts and thereby prevent static electricity from entering the casing.

The end of each ridge and that of a rib facing each other have their corners rounded or cut obliquely with respect to the direction of engagement, so that the casing parts can be smoothly joined with each other. This is also true with the corners of the hooks.

Various modifications will become possible for those skilled in the art after receiving the teachings of the present disclosure without departing from the scope thereof.

What is claimed is:

1. A casing for an electronic apparatus comprising:

a first casing part formed with a plurality of first hooks spaced from each other, and a plurality of ribs each intervening between nearby ones of said plurality of first hooks;

a second casing part formed with a plurality of second hooks spaced from each other and engageable with said plurality of first hooks, and a plurality of recesses each intervening between nearby ones of said plurality of second hooks and engageable with said plurality of ribs; and a plurality of ridges each being formed in a respective one of said plurality of recesses, and located to face a respective one of said plurality of ribs in a widthwise direction of side walls of said first and second casing parts for blocking a clearance between an end face of the respective rib and an end face of the respective recess facing each other.

2. A casing as claimed in claim 1, wherein a surface of the ridge and a surface of the rib facing each other have ends thereof rounded.

3. A casing as claimed in claim 1, wherein a surface of the ridge and a surface of the rib facing each other have their ends cut.

4. A casing as claimed in claim 1, wherein said plurality of first hooks and said plurality of second hooks each includes a flat end portion having corners formed between an end face and opposite side faces and rounded.

5. A casing as claimed in claim 1, wherein said plurality of first hooks and said plurality of second hooks each includes a flat end portion having corners formed between an end face and opposite side faces and cut.

* * * * *